US 7,091,607 B2

(12) United States Patent
Liu

(10) Patent No.: US 7,091,607 B2
(45) Date of Patent: Aug. 15, 2006

(54) SEMICONDUCTOR PACKAGE

(75) Inventor: Sheng Tsung Liu, Kaohsiung (TW)

(73) Assignee: Advanced Semiconductor Engineering Inc., (TW)

( * ) Notice: Subject to any disclaimer, the term of this patent is extended or adjusted under 35 U.S.C. 154(b) by 0 days.

(21) Appl. No.: 11/004,913

(22) Filed: Dec. 7, 2004

(65) Prior Publication Data
US 2005/0200007 A1    Sep. 15, 2005

(30) Foreign Application Priority Data
Mar. 11, 2004   (TW) .............................. 93106455 A

(51) Int. Cl.
*H01L 23/34* (2006.01)
(52) U.S. Cl. ................ 257/724; 257/723; 361/734
(58) Field of Classification Search ................ 257/686, 257/691, 724, 777, 924, E23.044, E23.057; 361/734
See application file for complete search history.

(56) References Cited

U.S. PATENT DOCUMENTS

| 5,313,693 | A | * | 5/1994 | Cachier ....................... 257/701 |
| 5,528,083 | A | * | 6/1996 | Malladi et al. ............. 257/786 |
| 5,633,785 | A |   | 5/1997 | Parker et al. |
| 6,005,778 | A |   | 12/1999 | Spielberger et al. |
| 6,222,246 | B1 | * | 4/2001 | Mak et al. ................... 257/532 |
| 6,222,260 | B1 | * | 4/2001 | Liang et al. ................. 257/691 |
| 6,303,423 | B1 | * | 10/2001 | Lin ............................. 438/238 |
| 6,335,566 | B1 | * | 1/2002 | Hirashima et al. .......... 257/686 |
| 6,373,127 | B1 |   | 4/2002 | Baudouin |
| 6,563,192 | B1 | * | 5/2003 | Corisis et al. .............. 257/532 |
| 6,611,434 | B1 | * | 8/2003 | Lo et al. ..................... 361/760 |
| 6,670,692 | B1 | * | 12/2003 | Shih et al. ................... 257/532 |
| 6,853,087 | B1 | * | 2/2005 | Neuhaus et al. ............ 257/778 |
| 2002/0135049 | A1 | * | 9/2002 | Liu ............................. 257/666 |
| 2004/0183209 | A1 | * | 9/2004 | Lin ............................. 257/778 |

* cited by examiner

*Primary Examiner*—Minhloan Tran
*Assistant Examiner*—Eduardo A. Rodela

(57) ABSTRACT

A semiconductor package includes a substrate, a chip, and at least one capacitor. The chip adheres to the substrate and has an active surface, a grounding area disposed on the active surface and at least one power pad mounted on the active surface. The capacitor is disposed on the grounding area of the chip and has a power end and a grounding end electrically connected to the grounding area. At least one bonding wire electrically connects the power end of the capacitor to the power pad.

20 Claims, 3 Drawing Sheets

SEMICONDUCTOR PACKAGE

This application claims the priority benefit of Taiwan Patent Application Serial Number 093106455, filed Mar. 11, 2004, the full disclosure of which is incorporated herein by reference.

BACKGROUND OF THE INVENTION

1. Field of the Invention

The present invention generally relates to a semiconductor package, and more particularly to a semiconductor package including at least one chip capacitor directly mounted on a grounding area of a chip.

2. Description of the Related Art

According to either a single-chip package or a multi-chip package, passive components, such as inductance, resistance and capacitor, are generally integrated with the packaged chip on a substrate or a leadframe, such that the integrated circuit of the package meets the specific electrical requirement. The above-mentioned passive component is mounted on the peripheral area of the substrate or the leadframe outside the chip. For example, the object of installation of a chip capacitor is to connect a power end and a grounding end of a circuit system so as to stabilize the circuit system by means of the decoupling function of the chip capacitor.

Referring to FIG. 1, a conventional semiconductor package 2 includes a chip 10 and a leadframe 20. The leadframe 20 has an unoccupied area 22 which is not occupied by the chip 10. A plurality of chip capacitors 30 are mounted on the unoccupied area 22 of the leadframe 20. A plurality of first bonding wires 12 are used for electrically connecting a plurality of power pads 14 of the chip 10 to power ends 32 of the chip capacitor 30, and a plurality of second bonding wires 34 are used for electrically connecting the power ends 32 of the chip capacitor 30 to a plurality of first leads 24 of the leadframe 20. A plurality of grounding pads (not shown) of the chip 10 are electrically connected to grounding ends 36 of the chip capacitors 30, and the grounding ends 36 of the chip capacitors 30 are electrically connected to a plurality of second leads 26 of the leadframe 20. Referring to FIG. 2, another conventional semiconductor package 50 includes a chip 60 and a substrate 70. The substrate 70 has an unoccupied area 72 which is not occupied by the chip 60. The substrate 70 further has a power ring 74 and a grounding ring 76, wherein the power ring 74 and the grounding ring 76 both are disposed on the unoccupied area 72. A plurality of chip capacitors 80 are mounted on the unoccupied area 72 of the substrate 70 and have power ends 82 and grounding ends 86, wherein the power ends 82 and grounding ends 86 are electrically connected to the power ring 74 and the grounding ring 76, respectively. A plurality of first bonding wires 62 are used for electrically connecting a plurality of power pads 64 of the chip 60 to the power ends 82 of the chip capacitor 80, and a plurality of second bonding wires 66 are used for electrically connecting a plurality of grounding pads 68 of the chip 60 to the grounding ends 86 of the chip capacitors 80. However, the arrangement of above-mentioned conventional semiconductor packages 2, 50 enlarges the size of the whole semiconductor package.

U.S. Pat. No. 5,633,785, entitled "Integrated Circuit Component Package with Integral Passive Component", discloses an interconnect substrate which is used and a plurality of passive components which are integrally formed therein, incorporated herein by reference. However, it is necessary to have an extra area of substrate for the structure which includes integrated circuit (IC) components integrated with the passive components, wherein the extra area is used for accommodating the passive components, such that the above-mentioned structure is enlarged or more complex, and further the packaging process is more difficult and has a higher cost.

U.S. Pat. No. 6,611,434, entitled "Stacked Multi-Chip Package Structure With On-Chip Integration Of Passive Component", discloses a stacked multi-chip package, incorporated herein by reference. Passive components of the stacked multi-chip package are mounted on an unoccupied area of the underlying semiconductor chip which is unoccupied by the overlying semiconductor chip, and thus the structure of the whole semiconductor package is tighter in size. However, according to the high density of semiconductor package, the unoccupied area still results in the limit of space.

U.S. Pat. No. 6,005,778, entitled "Chip Stacking And Capacitor Mounting Arrangement Including Spacer", discloses a multi-chip package, incorporated herein by reference. The multi-chip package includes a first chip, a second chip and a spacer which separates the first chip and second chip. The spacer provides for the first chip grounding in one application and provides for capacitors mounting in another application. The spacer has a top surface and a tiered surface which is electrically connected to the top surface. The passive component is mounted on the top surface of the spacer and has a conductive end and a grounding end which is electrically connected to the top surface. The conductive end and the tiered surface are electrically connected to a grounding pad and a power pad by means of bonding wires, respectively. The grounding pad and power pad are disposed on the first chip and are electrically connected to an external grounding pad and an external power pad by means of bonding wires, respectively. Also, the external grounding pad and external power pad are disposed on the area outside the first chip, such as on a substrate. However, the structure of the above-mentioned multi-chip package is complex and further the packaging process is more difficult and has a higher cost.

Accordingly, there exists a need for a semiconductor package capable of solving the above-mention disadvantages, and the semiconductor package includes at least one chip capacitor directly mounted on a grounding area of a chip and further has a compact structure.

SUMMARY OF THE INVENTION

It is an object of the present invention to provide the semiconductor package including at least one chip capacitor directly mounted on a grounding area of a chip and further has a compact structure.

The present invention provides a semiconductor package including a substrate, a chip, and at least one chip capacitor. The chip adheres to the substrate and has an active surface, a grounding area disposed on the active surface and at least one power pad mounted on the active surface. The chip capacitor is disposed on the grounding area of the chip and has a power end and a grounding end electrically connected to the grounding area. A bonding wire electrically connects the power end of the chip capacitor to the power pad.

According to the semiconductor package of the present invention, the grounding ends of the chip capacitors are directly soldered to the grounding area of the chip by using a solder paste or are directly electrically connected to the grounding area of the chip by using a conductive adhesive, and the power ends of the chip capacitors are electrically connected to the power ring of the substrate or the leads of the leadframe, thereby further stabilizing the circuit system by means of the decoupling function of the chip capacitor. Furthermore, it is not necessary to dispose a specific substrate accommodating the chip capacitors for the semiconductor package. The chip capacitors are directly soldered to the grounding area of the chip, and thus the number and density of chip capacitors can be increased.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
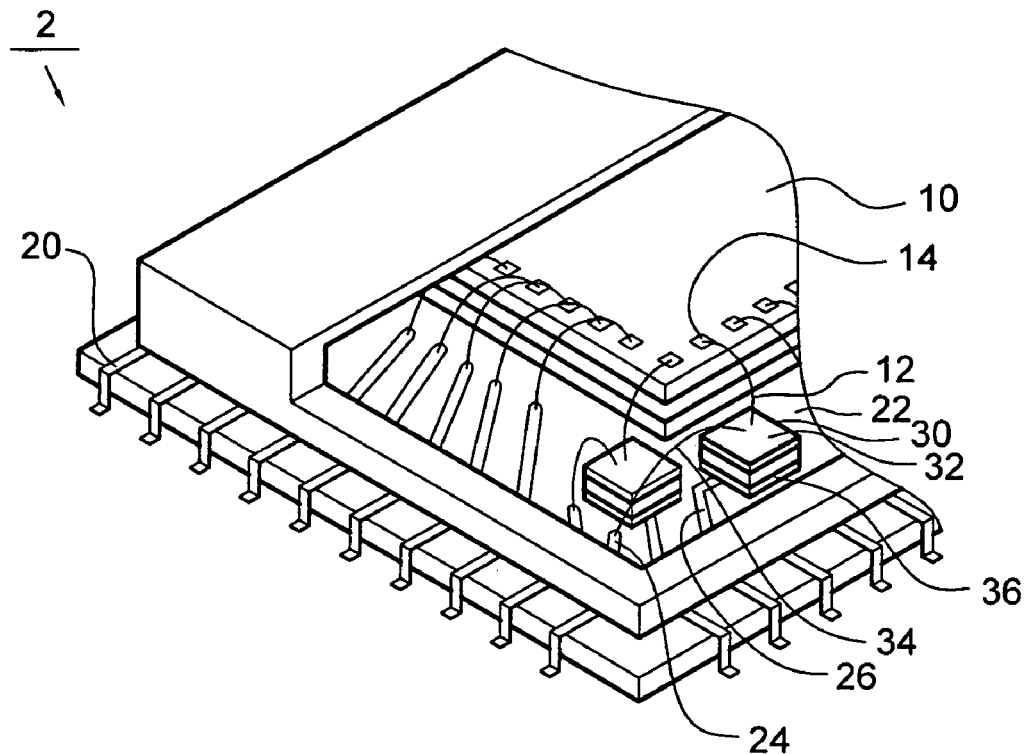
FIG. 1 is a partially cutway perspective schematic view of a semiconductor package in the prior art.
Figure 2:
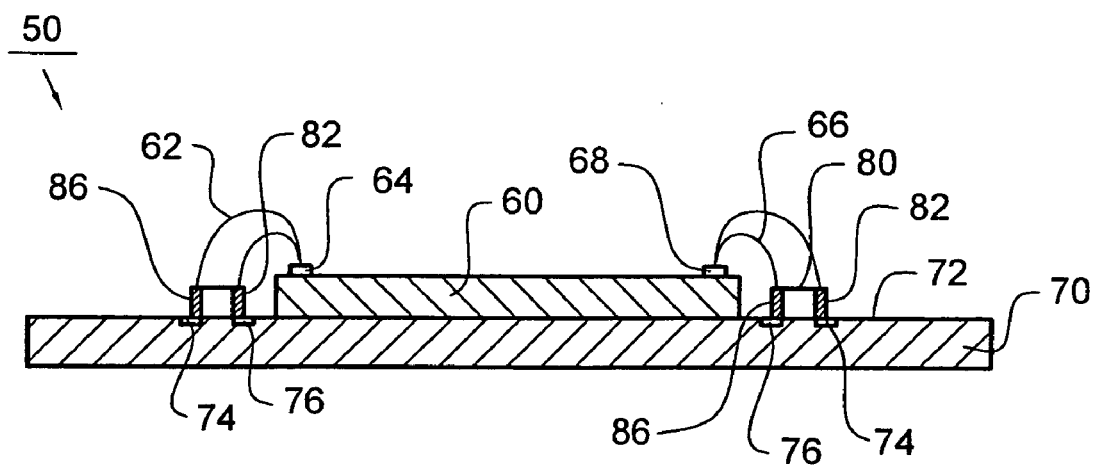
FIG. 2 is a cross-sectional schematic view of another semiconductor package in the prior art.
Figure 3:
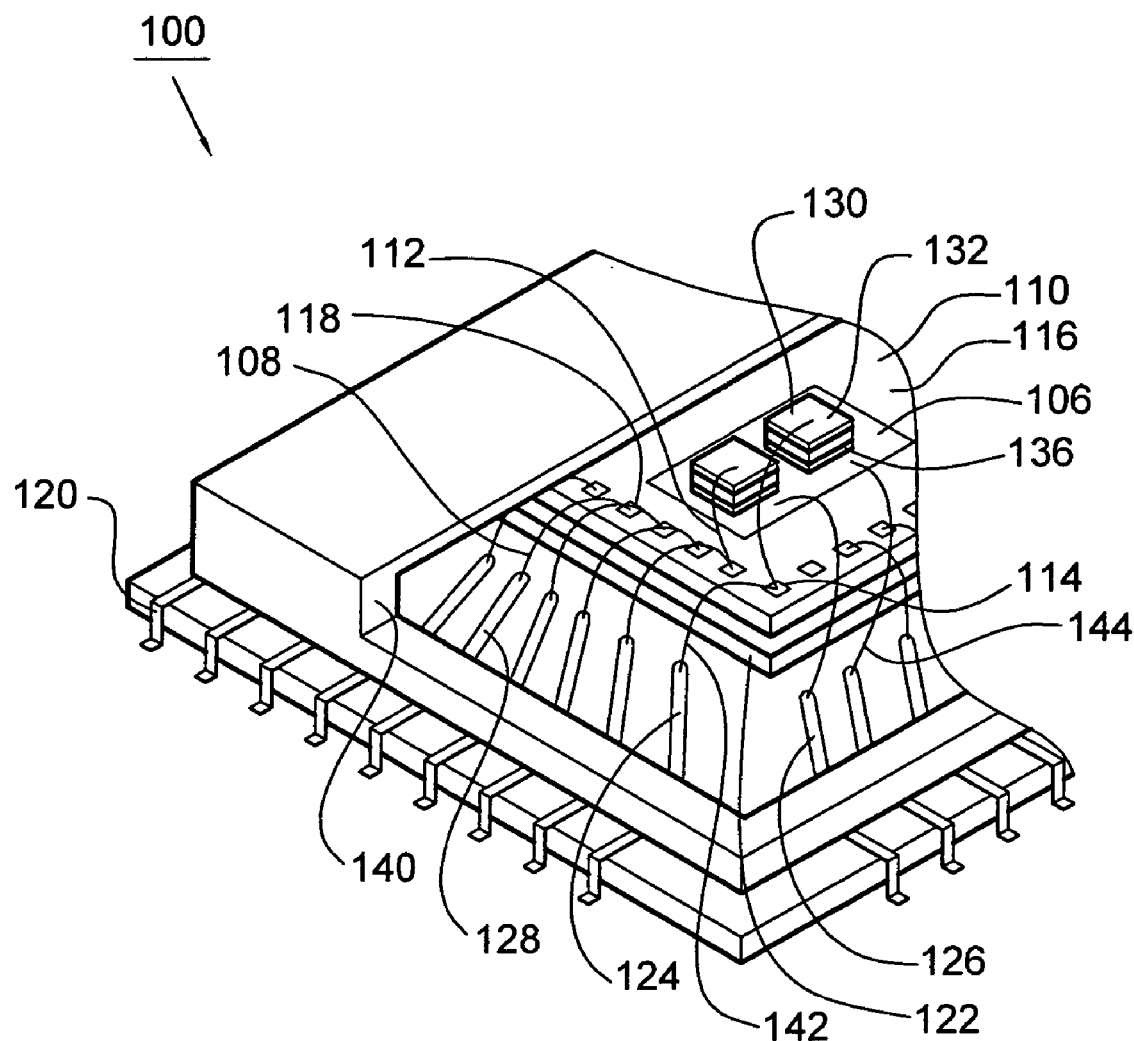
FIG. 3 is a partially cutway perspective schematic view of a semiconductor package according to an embodiment of the present invention.

Referring to FIG. 3, it depicts a semiconductor package 100 according to an embodiment of the present invention. The semiconductor package 100 includes a chip 110 and a leadframe 120. The leadframe 120 includes a plurality of first leads 128 and a die pad 122, and the chip 110 adheres to the die pad 122 by using an adhesive (not shown). The chip 110 has an active surface 116 and a plurality of signal pads 118 disposed on the active surface 116. Also, a plurality of first bonding wires 108 are used for electrically connecting the signal pad 118 to a plurality of first leads 128 of the lead frame 120. The chip 110 further has a grounding area 106 and a plurality of power pads 114, wherein the grounding area 106 and power pads 114 all are disposed on the active surface 116. Preferably, the grounding area 106 is a flat disposing area. The grounding area 106 can be a grounding pad with large area or a plurality of grounding pads with small area, wherein the grounding pads all can be formed by using photolithography and etching processes of a redistribution layer, and the grounding pad can be a metal sheet (e.g. a copper layer or aluminum layer), which is made of electrically conductive material. A plurality of chip capacitors 130 are mounted on the grounding pad 106 of the chip 110, and the chip capacitor 130 has power end 132 and a grounding end 136. The power ends 132 are electrically connected to the power pads 114 by means of a plurality of second bonding wires 112. The grounding end 136 can be soldered to the grounding area 106 by using a solder paste (not shown) or be electrically connected to the grounding area 106 by using a conductive adhesive (not shown). For example, when the grounding area 106 is a copper layer, the grounding end 136 of the chip capacitor 130 is soldered to the grounding area 106 by using a solder paste, and preferably the chip capacitor 130 can have a metal layer with Nickel and Tin (Ni/Sn) disposed on the grounding end 136 for promoting the soldering process. For another example, when the grounding area 106 is an aluminum layer, the grounding end 136 of the chip capacitor 130 is electrically connected to the grounding area 106 by using a conductive adhesive (not shown). The leadframe 120 further includes a plurality of second and third leads 124, 126. A plurality of third bonding wires 142 is used for electrically connecting the power pads 114 of the chip 110 to the second leads 124 of the leadframe 120, and a plurality of forth bonding wires 144 is used for electrically connecting the grounding area 106 of the chip 110 to the third leads 126 of the leadframe 120. The chip 110, the passive components 130, the first, second, third and forth bonding wires 108, 112, 142 and 144, the die pad 122 and parts of the first, second and third leads 128, 124 and 126 are encapsulated by an encapsulant 140.

Figure 4:
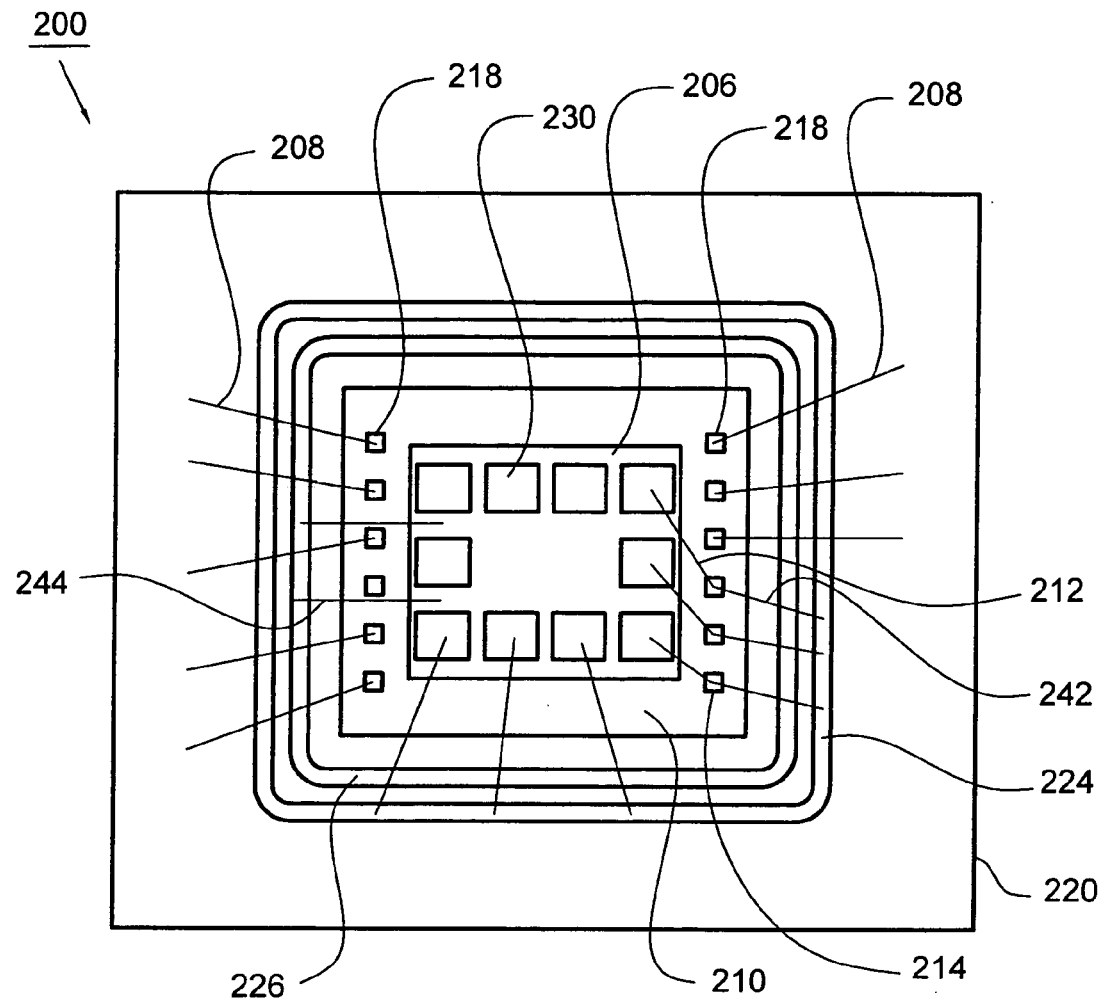
FIG. 4 is a plane schematic view of a semiconductor package according to another embodiment of the present invention.
Figure 5:
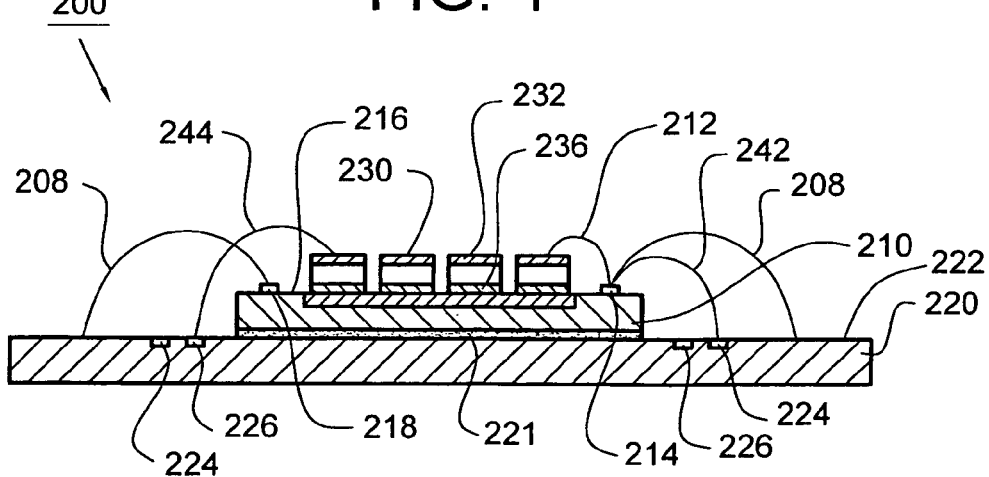
FIG. 5 is a cross-sectional schematic view of a semiconductor package according to another embodiment of the present invention.

Referring to FIGS. 4 and 5, they depict a semiconductor package 200 according to an embodiment of the present invention. The semiconductor package 200 includes a chip 210 and a substrate 220. The substrate 220, such as bismaleimide-triazine (BT) resin substrate, has an upper surface 222, and the chip 210 adheres to the upper surface 222 of the substrate 220 by using an adhesive 221. The chip 210 has an active surface 216 and a plurality of signal pads 218 disposed on the active surface 216. Also, a plurality of first bonding wires 208 are used for electrically connecting the signal pad 218 to the substrate 220. The chip 210 further has a grounding area 206 and a plurality of power pads 214, wherein the grounding area 206 and power pads 214 all are disposed on the active surface 216. Preferably, the grounding area 206 is a flat disposing area. The grounding area 206 can be a grounding pad with large area or a plurality of grounding pads with small area, wherein the grounding pads all can be formed by using photolithography and etching processes of a redistribution layer, and the grounding pad can be a metal sheet (e.g. a copper layer or aluminum layer), which is made of electrically conductive material. A plurality of chip capacitors 230 are mounted on the grounding pad 206 of the chip 210, and the chip capacitor 230 has a power end 232 and a grounding end 236. The power ends 232 are electrically connected to the power pads 214 by means of a plurality of second bonding wires 212. The grounding end 236 can be soldered to the grounding area 206 by using a solder paste (not shown) or be electrically connected to the grounding area 206 by using a conductive adhesive (not shown). For example, when the grounding area 206 is a copper layer, the grounding end 236 of the chip capacitor 230 is soldered to the grounding area 206 by using a solder paste, and preferably the chip capacitor 230 can has a metal layer with Nickel and Tin (Ni/Sn) disposed on the grounding end 236 for promoting the soldering process. For another example, when the grounding area 206 is an aluminum layer, the grounding end 236 of the chip capacitor 230 is electrically connected to the grounding area 206 by using a conductive adhesive (not shown). The substrate 220 includes a power ring 224 and a grounding ring 226, wherein the power ring 224 and grounding ring 226 both are disposed on the upper surface 222 and surround the chip 210. A plurality of third bonding wires 242 are used for electrically connecting a plurality of power pads 214 of the chip 210 to the power ring 224 of the substrate 220, and a plurality of forth bonding wires 244 are used for electrically connecting the grounding area 206 of the chip 210 to the grounding ring 226 of the substrate 220. The chip 210, the passive components 230, the first, second, third and forth bonding wires 208, 212, 242 and 244 and the upper surface 222 of the substrate 220 are encapsulated by an encapsulant (not shown).

According to the semiconductor package of the present invention, the grounding ends of the chip capacitors are directly soldered to the grounding area of the chip, and the power ends of the chip capacitors are electrically connected to the power ring of the substrate or the leads of the leadframe, thereby further stabilizing the circuit system by means of the decoupling function of the chip capacitor. Furthermore, it is not necessary to dispose a specific substrate accommodating the chip capacitors for the semiconductor package. The chip capacitors are directly soldered to the grounding area of the chip, and thus the number and density of chip capacitors can be increased.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package, comprising:
   a carrier;
   a chip disposed on the carrier and having an active surface, a grounding area disposed on the active surface and at least one power pad disposed on the active surface;
   at least one capacitor directly disposed on the grounding area of the chip and having a power end and a grounding end electrically connected to the grounding area; and
   at least one bonding wire electrically connecting the power end of the capacitor to the power pad.

2. The semiconductor package as claimed in claim 1, wherein the carrier is a substrate including a power ring surrounding the chip and a grounding ring surrounding the chip;
   the semiconductor package further comprising a plurality of second and third bonding wires electrically connecting the power pad of the chip to the power ring of the substrate and electrically connecting the grounding area of the chip to the grounding ring of the substrate, respectively.

3. The semiconductor package as claimed in claim 1, wherein the carrier is a leadframe further having a plurality of first and second leads;
   the semiconductor package further comprising a plurality of second and third bonding wires electrically connecting the power pad of the chip to the first lead of the leadframe and electrically connecting the grounding area of the chip to the second lead of the leadframe, respectively.

4. The semiconductor package as claimed in claim 1, further comprising a solder paste soldering the grounding end of the capacitor to the grounding area.

5. The semiconductor package as claimed in claim 4, wherein the capacitor further has a metal layer comprising Nickel and Tin, and the metal layer is disposed between the grounding end and the grounding area.

6. The semiconductor package as claimed in claim 1, further comprising a conductive adhesive electrically connecting and physically bonding the grounding end of the capacitor to the grounding area.

7. The semiconductor package as claimed in claim 1, wherein the grounding area is formed by using photolithography and etching processes of a redistribution layer.

8. The semiconductor package as claimed in claim 1, wherein the grounding area is made of electrically conductive material.

9. The semiconductor package as claimed in claim 8, wherein the grounding area is a metal sheet.

10. The semiconductor package as claimed in claim 8, wherein the grounding area is a copper layer.

11. The semiconductor package as claimed in claim 1, wherein the grounding area comprises a plurality of grounding pads and the grounding end of the capacitor is soldered to one of the grounding pads.

12. The semiconductor package as claimed in claim 1, wherein
   said chip is disposed on top of said carrier and has an upper surface as said active surface;
   said at least one capacitor has an upper terminal as said power end and a lower terminal as said grounding end; and
   said package further comprises a conductive bonding material physically sandwiched between said lower terminal of said capacitor and the grounding area of the upper, active surface of said chip, said bonding material both physically fixing the capacitor to said upper, active surface of said chip and electrically connecting the lower terminal of said capacitor to said grounding area.

13. The semiconductor package as claimed in claim 12, further comprising multiple said capacitors disposed side by side within said grounding area which comprises a conductive material layer extending continuously underneath and physically supporting from below all said multiple capacitors.

14. The semiconductor package as claimed in claim 13, wherein the carrier is a substrate including a power ring surrounding the chip and a grounding ring surrounding the chip;
   the semiconductor package further comprising a further bonding wire electrically and directly connecting said conductive material layer of the grounding area to the grounding ring of the substrate.

15. The semiconductor package as claimed in claim 14, wherein said conductive material layer has a portion which is not located underneath any of said capacitors and which is electrically connected and physically bonded to an end of said further bonding wire.

16. The semiconductor package as claimed in claim 13, wherein the carrier is a leadframe further having at least first and second leads;
   the semiconductor package further comprising second and third bonding wires electrically connecting the power pad of the chip to the first lead of the leadframe and electrically and directly connecting said conductive material layer of the grounding area to the second lead of the leadframe, respectively.

17. The semiconductor package as claimed in claim 16, wherein said conductive material layer has a portion which is not located underneath any of said capacitors and on which an end of said third bonding wire lands.

18. The semiconductor package as claimed in claim 12, wherein said grounding area comprises a conductive material layer extending continuously underneath and physically supporting from below said capacitor;
   said conductive material layer further extending continuously, radially outwardly beyond a boundary of said lower terminal of said capacitor to define a peripheral zone surrounding said capacitor;
   said package further comprising a further bonding wire electrically connecting said conductive material layer of said grounding area to a grounding terminal of said package, said further bonding wire having an end located in said peripheral zone.

19. The semiconductor package as claimed in claim 18, wherein said grounding terminal of said package is either a grounding ring which is located on an upper surface of said carrier and surrounds the chip or a lead of a leadframe being used as said carrier.

20. The semiconductor package as claimed in claim 12, wherein said bonding wire is the only bonding wire electrically connecting the upper terminal of the capacitor to the power pad.

* * * * *